(12) United States Patent
Kimelman

(10) Patent No.: US 10,277,213 B1
(45) Date of Patent: Apr. 30, 2019

(54) GLITCH DETECTION IN INPUT/OUTPUT BUS

(71) Applicant: NXP USA, Inc., Austin, TX (US)

(72) Inventor: Paul Kimelman, Alamo, CA (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/795,125

(22) Filed: Oct. 26, 2017

(51) Int. Cl.
*H03K 5/1252* (2006.01)
*H03K 19/21* (2006.01)
*H03K 5/00* (2006.01)

(52) U.S. Cl.
CPC ............ *H03K 5/1252* (2013.01); *H03K 19/21* (2013.01); *H03K 2005/00104* (2013.01); *H03K 2005/00234* (2013.01)

(58) Field of Classification Search
CPC ................ H03K 5/1252; H03K 19/21; H03K 2005/00104; H03K 2005/00234
See application file for complete search history.

(56) References Cited

U.S. PATENT DOCUMENTS

| 5,168,181 A * | 12/1992 | Baiocchi ............... H03K 5/1252 326/26 |
| 5,386,159 A * | 1/1995 | Dupre .................. H03K 5/1252 327/310 |
| 5,563,532 A | 10/1996 | Wu et al. |
| 6,055,587 A | 4/2000 | Asami et al. |
| 7,911,221 B2 * | 3/2011 | Yamaoka ......... H03K 19/00346 326/12 |
| 9,378,077 B2 * | 6/2016 | Pappalardo ......... G06F 11/0751 |

FOREIGN PATENT DOCUMENTS

JP   H07303034 A   11/1995

* cited by examiner

*Primary Examiner* — Jung Kim

(57) ABSTRACT

A delay circuit, including a connector pad to receive a data input, a pad pin to receive a clock input having a clock edge, a first data line to receive the data input, a second data line to receive the data input, the second data line including a delay circuit that outputs a delayed data output, and at least one logic gate to accept the data input and delayed data output and output a logic state, wherein the logic state determines whether there is a glitch in the delayed data output, and wherein the delay circuit includes at least one delay element to register an output of the at least one logic gate at the clock edge to recognize the glitch.

5 Claims, 4 Drawing Sheets

GLITCH DETECTION IN INPUT/OUTPUT BUS

TECHNICAL FIELD

Various exemplary embodiments disclosed herein relate to chip-to-chip communication, and more particularly to apparatuses and methods to enable low cost glitch detection in clock and data peripheral buses.

SUMMARY

A brief summary of various embodiments is presented below. Some simplifications and omissions may be made in the following summary, which is intended to highlight and introduce some aspects of the various embodiments, but not to limit the scope of the invention. Detailed descriptions of embodiments adequate to allow those of ordinary skill in the art to make and use the inventive concepts will follow in later sections.

Various embodiments include a delay circuit, including a connector pad configured to receive a data input, a pad pin configured to receive a clock input having a clock edge, a first data line to receive the data input, a second data line to receive the data input, the second data line including a delay circuit that outputs a delayed data output, and at least one logic gate to accept the data input and delayed data output and output a logic state, wherein the logic state determines whether there is a glitch in the delayed data output, wherein the delay circuit includes at least one delay element to register an output of the at least one logic gate at the clock edge to recognize the glitch.

The delay circuit may include a latch delay chain circuit or a delay buffer.

The delay circuit may include a plurality of latches or a plurality of delay buffers. The delay circuit may include a plurality of logic gates, wherein the data line outputs from the plurality of latches or buffers are used to determine intermittent glitches in the delay circuit.

The at least one logic gate may be a single exclusive OR gate.

Various embodiments also include a delay circuit including a connector to receive a clock input, a first clock line to receive the clock input, a second clock line to receive the clock input, the clock line including a plurality of delay devices configured to delay a timing of the clock input, and a logic block configured to receive one or a plurality of delayed clock inputs and whether there is a glitch in the setup time before a clock edge, wherein the plurality of delay devices include at least delay element to register an output of the logic block on a clock edge so as to recognize the glitch.

Various embodiments also include a method of receiving a timing signal, the method including inputting an input signal through a pad pin, dividing the input signal along a control path and a delayed path, in the delay path, delaying the input signal through a predetermined number of delay components to produce at least one delayed input signal, and comparing the at least one delayed input signal with another signal to determine if the delayed signal includes a glitch at or near a clock edge.

The input signal may be a data signal. The input signal may be a clock signal. The input signal may be delayed through a buffer. The input signal may be delayed through a plurality of latches.

A plurality of delayed input signals may be input into a plurality of logic gates to determine if the delayed signal includes the glitch.

The at least one delayed input signals in the delay path may be compared with an input signal of the control path to determine if the delayed signal includes the glitch.

BRIEF DESCRIPTION OF THE DRAWINGS

Additional objects and features of the invention will be more readily apparent from the following detailed description and appended claims when taken in conjunction with the drawings.

Although several embodiments are illustrated and described, like reference numerals identify like parts in each of the figures, in which.

DETAILED DESCRIPTION

Figure 1:
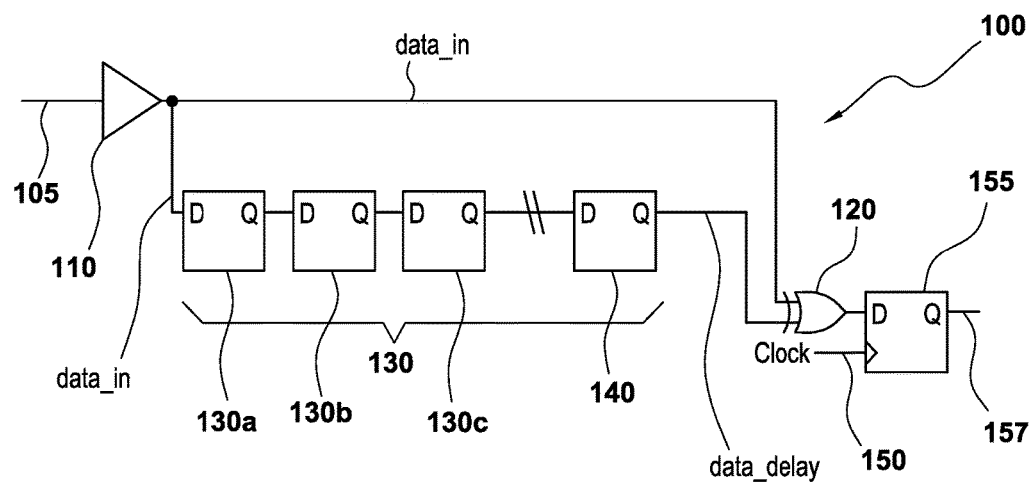
FIG. 1 illustrates a latch delay chain to detect a glitch in accordance with embodiments described herein.

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art, and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

Embodiments described herein use a chain of latches to obtain an equivalent of oversampling for a short period leading into a clock pulse. The chain of latches is a buffer-like delay model. Embodiments include detection of noise or a glitch in data and/or clock signals. Glitch as used herein is in reference to a spike of noise on a pin. Basically an inappropriate change in states, which may be caused by external noise coupled into the bus or ground plane. For the "slave" of an external clock/data bus (e.g. i2c, i3c, SPI), a bus clock can be used as the peripheral clock for serializing/deserializing and other actions. Of concern is the potential for glitches/noise on the data line(s) at the clock edge. There may also be glitching on the clock. Adressed herein is metastability, sampling the wrong state, and ground bounce leading into the setup of the clock.

Metastability in electronics is the ability of a digital electronics system to persist for an unbounded time in an unstable equilibrium or metastable state. In metastable states, the circuit may be unable to settle into a stable '0' or '1' logic level within the time required for proper circuit operation. This usually happens when the data is changing in the setup of a flop, or when the data is run through different logic paths with different times to settle (so getting two different values, which should never logically happen). As a result, the circuit can act in unpredictable ways, and may lead to a system failure, or unpredictable/erroneous operation. Approaches to deal with this problem include specialized analog filters (that have PVT concerns) and/or fast clocks (for oversampling and filtering). Both approaches have issues with wasting power, and require extra components.

Detection is a safer option as filtering often results in incorrect data when noise occurs close to the clock. Detection may help in debugging a line such as determining that the line had noise issues, possibly due to wiring or drive strength/slew (e.g. common mode injection). In normal use, detection can be used to cause the resending of data to avoid capture of incorrect information or commands. Embodiments described herein can be used for Master and Slave, clock, and data. Using detection involves low power and focuses on actual area of interest.

As described herein, final registered data that is available at a clock pulse or edge may be compared with the data as it looked a few nanoseconds before. If the two data values do not match, then an error is generated, as one approach, or the mismatch may be used as a sort of filter. Embodiments provide an equivalent of very fast oversampling at a period next to the clock, without the need for a fast clock, the latter which could have problems with power as well as cost of higher speed clocks.

Embodiments described herein involve data and data transmission rates used in bus interfaces such as I3C. I3C is a bus interface configured to connect sensors to an application processor. I3C is a specification that incorporates attributes of inter-integrated circuit (I2C) and serial peripheral interface (SPI), as an alternative interface encompassing the benefits of these interfaces into one interface. I3C builds on the capabilities of I2C and the ecosystem that has grown up around it, while preserving a two-wire serial interface. Using I3C, system designers can connect a plurality of sensors, while reducing power consumption, component and implementation costs. The data rates supported on an I3C bus depend on the bus mode, the type of devices on the bus, and their capabilities. The presence of multiple devices on the same bus increases the chances of noise due to longer traces, stubs, and more slewing on the lines.

Noise detection apparatuses and methods described herein include low cost, drop in, technology independent solutions. Example embodiments may work on 7 pin, 350 nm digital processes as well as large devices in the most advanced process geometry. It also works regardless of the bus voltage in use. A compact design may enable low cost, and ease of implementation.

Regarding clock and data communications, embodiments described herein include use of delaying schemes, allowing measurements, to take a measure between the time where the signal should be stable, and when it is actually registered by the device, to ensure no variation.

Independent of propagation delay, capacitance, and other factors, as long as a data line is settled by the time the clock edge is detected on the receiving side, the circuit is satisfied that it knows what the value is supposed to be. Using a short duration buffer, any glitches outside of the detection zone, or setup time, are correctly ignored.

One method described herein is to measure a time leading up to the period when the clock edge changes. That time period is being measured, from the standpoint of the data. The method described herein does not care what happened leading into the event, nor how long it took. As discussed herein, this is what is usually referred to as the setup time relative to the clock.

In addition to diagnosing data errors, circuits and methods described herein can be used for measuring that there is no clock glitching right around the edge. Glitching around a clock edge could mean there is a false edge or a false clock, such as a runt clock.

According to embodiments, an edge or transition scheme at the beginning of a delay line is not seen until some number of nanoseconds at the other end of the delay line. This allows a comparison of a present undelayed version of the data or clock signal and a delayed version of the same. Use of a logic gate such as exclusive OR (aka XOR) may detect a difference in signal values. If the delayed and undelayed signals are the same, then a true signal has been held, or appears to have been held over that period of the delay. This scheme applies to a buffer delay circuit illustrated and described herein. A delay line may include a series of latches or a single delay buffer.

In another embodiment, a plurality of latches may be used to verify a signal or determine glitches that have shorter delays, such that the glitch starts after the delay line and settles before the clock edge. Using a plurality of latches, a determination can be made that even during the period of the delay, such as in the delay circuit described herein, there was no measurable transition or glitch that took place.

In general, a magnitude of the delay or glitch may be three to five nanoseconds; this is usually a short high energy spike flattening out due to capacitance. Embodiments described herein are concerned with an amount of time preceding the clock edge that the data or clock is expected to be stable, and a trigger level that defines the clock edge.

Data and clock signals on an I3C bus may have a hold time and a setup time. Hold time refers to how long the data stays stable after a clock pulse. Embodiments described herein are concerned with the stability of the signal leading into the clock pulse, which is the setup time. Circuits and methods described herein include the amount of time the data is supposed to be stable before the clock edge. As a data stream approaches a clock edge, the data may be uncertain, possibly changing up to the last few nanoseconds. The time leading up to the clock edge is dependent on the technology used and internal delays. It is usually margined for safety. This is the setup time of the next clock edge. During this period, the data is expected to stay stable in whichever state it is in, High or Low.

The glitch detection circuit according to embodiments described herein determines whether the data or clock line was stable by the predetermined period in advance, and therefore it was not changing during the metastable component of setup. As mentioned above, metastability into the clock edge refers to uncertainty if data changes too close to the clock edge. In such a case the circuit is unable to determine if a flip-flop captures a one or a zero, or even whether that will be a stable one or zero, because of the behavior of the electronics. Additionally, the metastability means that the data was glitching at that point and creates an uncertainty in the value; likewise, even if the glitch starts before the metastable setup of the flip-flop, it will cause the wrong value to be captured. Noise can occur anywhere. Embodiments described herein will detect whether unwanted noise or a glitch occurs in the setup area of the clock.

FIG. 1 illustrates a delay circuit 100 to detect a glitch in accordance with embodiments described herein. The delay circuit 100 may include a data pin 105 at an input/output (IO) pad 110 to receive an incoming signal data_in (and convert into internal digital 1 or 0). Besides feeding into the peripheral for use as data, the IO pad 110 may distribute the signal data_in to a logic gate such as an exclusive OR logic gate 120 and to the beginning of a latch delay chain 130, which could also just be a delay buffer. The latch delay chain 130 may be configurable, determined by a number of elements therein, to set a desired approximate amount of time to delay the data_in signal, varying somewhat over process, voltage, and temperature. The latch delay chain 130 may include intermediate latch elements 130a-130c and a final latch element 130d. The number of intermediate elements may be greater or lower depending on a desired buffer delay time period, and likewise a delay buffer of a desired delay period may replace all of the latch chain 130. After data_in passes through the final latch element 130d, a data_delay signal is output. To determine whether there is a glitch in the data_delay line, the logic gate 120 will output whether both inputs are the same. A clock signal 150 triggers an output flip-flop 155 to pass the stored determination value to a glitch output 157. If both values are the same, the logic gate 120 will output a zero, signifying no glitch detected. If both values are different, the logic gate 120 will output a one, indicating a glitch on the data_delay line. The output of logic gate 120 is taken into account when the clock edge of clock signal 150 is triggered. For example, the latch delay chain 130 may be configured for an eight nanosecond delay. When the clock signal 150 is triggered, and a comparison is made at the XOR logic gate 120 between the data_in line and the data_delay line, a system controller will record if the data_in line was the same value eight nanoseconds before, as it is now. If not, then the data_in changed less than eight nanoseconds before the clock edge.

The latch delay chain 130 is a logic device that transmits the data_in signal. The latch delay chain 130 uses the plurality of delay elements 130a, 130b, 130c, and 130d, though the number of delay components is not limited thereto.

The setup time is a safe time in which the data line must be stable for the underlying logic (flip-flops) of the peripheral to arrive at a correct result. This encompasses path time and flop "setup" time over process, voltage, and temperature. Process may refer to variations in a die due to processing factors, such as thicknesses of oxide layers. Voltage and temperature are varying environmental factors. A different value for data_delay during this setup time than data_in will determine a glitch in the setup time. With replication of the flip-flop 155, and triggering on the other clock edge (i.e. the falling edge), the circuit of FIG. 1 can be used to detect glitches into both clock edges. The utility of doing so depends on the bus and whether data is sampled on one or both clock edges.

Figure 2:
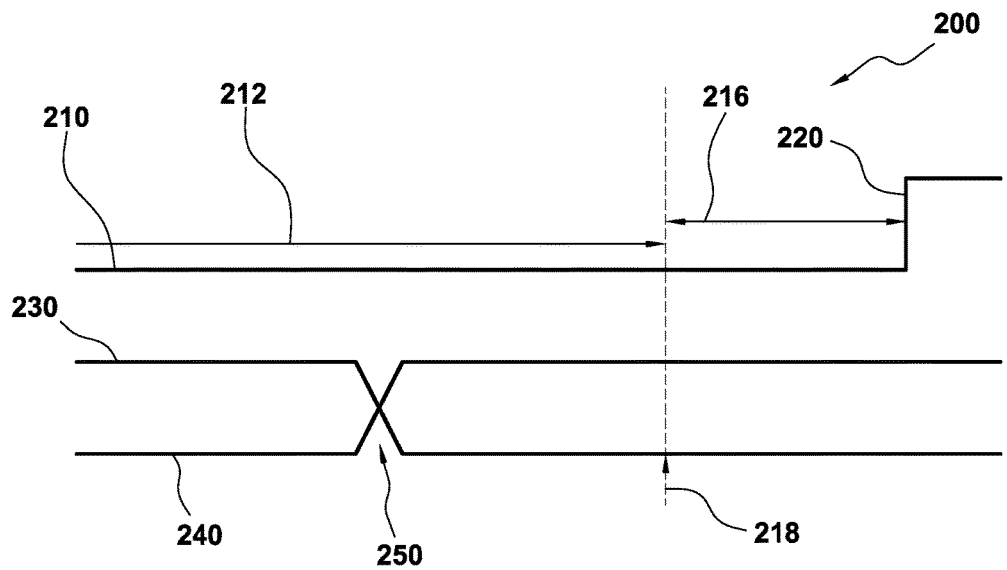
FIG. 2 illustrates a timing diagram in accordance with FIG. 1.

FIG. 2 illustrates a timing diagram 200 in accordance with FIG. 1. A clock signal 210 will have a clock edge 220. Examples of a data signal are illustrated as line 230 or line 240. Data lines 230 and 240 represent a same data signal. They are represented as two separate lines to designate that a data signal may either start high or start low. Embodiments described herein are concerned with changes or potential changes in the data signal. A data signal 230 or 240 will have a lead-in time during a time segment 212 along a delay path before entering the latch delay chain 130. Reference numeral 218 represents a beginning time moment that the data_in signal enters the latch delay chain 130. As illustrated in FIG. 2. A data_in signal is delayed by the number and type of components in the latch delay chain 130. The data_in signal exits the latch delay chain 130 as a data_delay signal. The beginning time moment 218 may be predetermined by the circuit designer based on number of latches or delay buffer size. The data lines may either be a positive to negative data signal 230 or a negative to positive signal 240, or a data line may not shift in polarity when approaching a beginning moment 218 of the delay buffer 130. The setup time segment 216 may span from the beginning moment 218 at the beginning of the delay buffer 130 until the rising edge 220 of the clock line 150 is triggered. During the setup time 216, the data_delay signal is output the last flop 130d and input the logic gate 120 of FIG. 1, and compared to the data_in signal. If the signals have the same value, there was no glitch in the data line leading into the clock and the logic gate 120 will output a zero. If the two values are different, a glitch was detected and the gate 120 will output a one.

In a normal non-glitch state, either the positive or negative data signals 230 or 240 may transition at a transition point 250 before the rising edge 220 of the clock and before the begin of delay buffer beginning moment 218, well enough in advance of the rising edge 220 of the clock before the setup time. The rising edge 220 of the clock corresponds to the moment data_in and data_delay enter the logic gate 120 of FIG. 1

Figure 3:
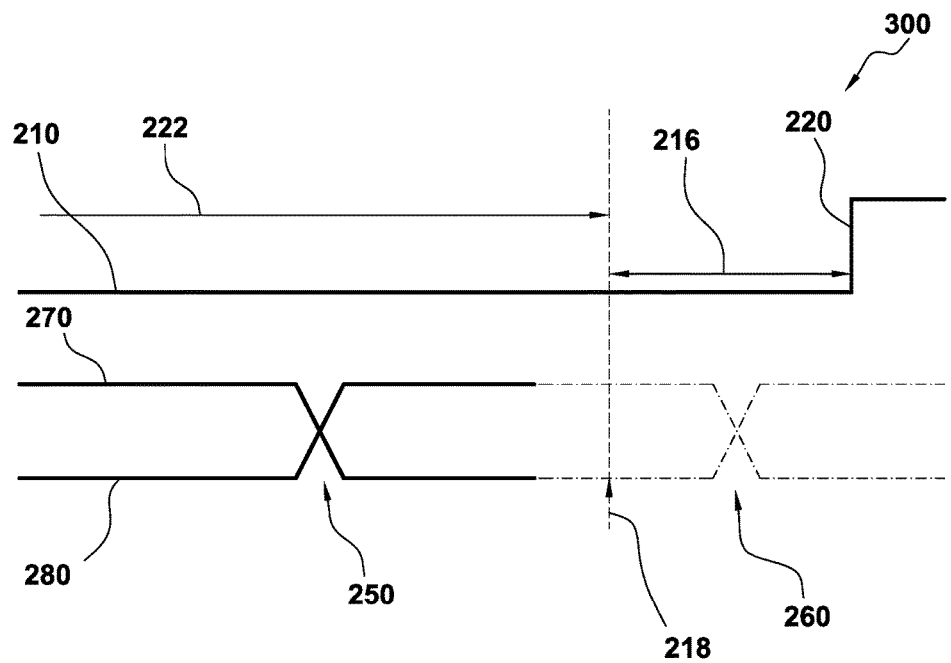
FIG. 3 illustrates another timing diagram in accordance with FIG. 1.

FIG. 3 illustrates another timing diagram 300 in accordance with FIG. 1. FIG. 3 illustrates the effect of a glitch occurring in the setup time after the beginning of delay buffer beginning moment 218 of the delay buffer 130 and before the rising edge 220 of the clock. The alternate example data lines in FIG. 3 are represented as data signals 270 and 280. In FIG. 3, example data signals 270 and 280 entering the delay buffer beginning moment 218 are not the same as values of data signals 270 and 280 when the clock is triggered at the rising edge 220 of the clock. In FIG. 3, at time 260 a glitch appears on the data signal during the setup time 216, causing a data line to change state. This difference in data line value value outputs a one at the XOR logic gate 120 of FIG. 1, which is output to output flip-flop 155 and further output as detection of a glitch in the detection circuit 100.

Figure 4:
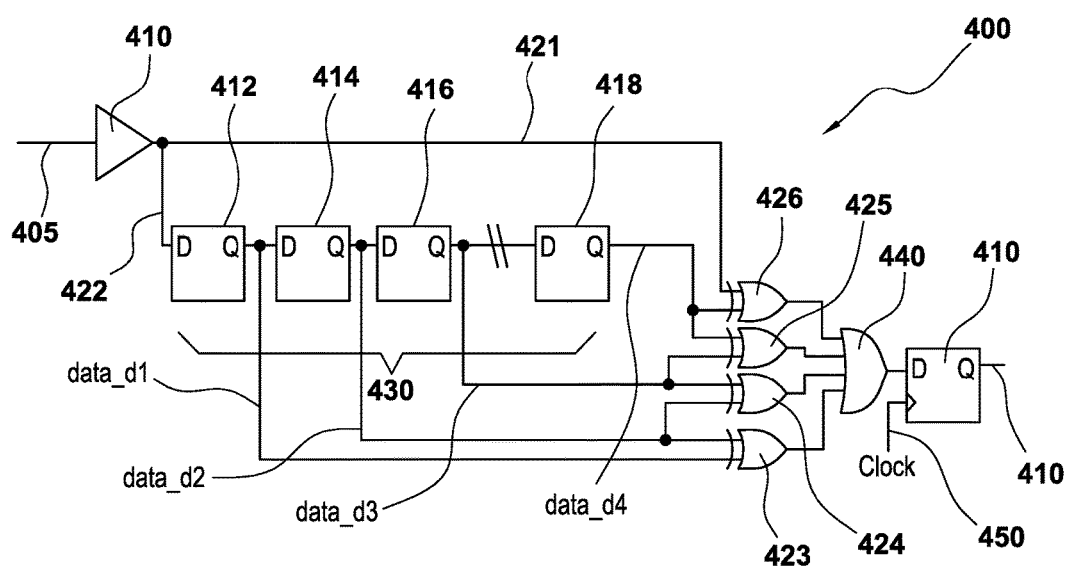
FIG. 4 illustrates a data delay chain in accordance with embodiments described herein.

FIG. 4 illustrates a data delay circuit 400 including a delay chain 430 in accordance with embodiments described herein. This circuit is similar to FIG. 1, except it can detect glitches anywhere in the setup, even if they resolve correctly by the clock edge. This circuit 400 cannot be implemented using a single delay buffer, unlike FIG. 1. The delay chain 430 includes a plurality of latches 412, 414, 416, and 418 to detect glitches leading into a clock. The number of latches 412-418 are not limited thereto, and may be a lesser or greater amount depending on a desired approximate time delay during the setup period. The delay chain 430 may input a data_in signal that is divided into a control path 421 and a delay path 422. Differing from the embodiment of FIG. 1, the delay delay circuit 400 may compare a plurality of data_delay signals output from intermediate latches 412-418 to determine if a glitch occurs in a data line in smaller increments leading up to a clock pulse.

Each latch 412, 414, 416, and 418 adds a small delay such as say 1ns, such that four latches 412-418 would add visibility to the data_in over four nanoseconds. Latch delays may be set to have different time delays depending on the discretion of a circuit designer and the nature of the latches in the process technology. The number of latches may also vary. Each latch 412-418 produces a respective staggered delayed signal data_d1, data_d2, data_d3, and data_d4. This focuses the detection zone around the clock edge used to register the actual data to use. The detect is offline from the registered data, so does not impact a deserializer or other use of the data.

As illustrated in FIG. 4, an output signal from the latch 412 is a data_d1 signal. At a logic gate 423, the data_d1 signal delayed 1 ns, is compared to a data_d2 signal output from the latch 414, delayed 2 ns. Similar comparisons are made with respective data_d2 and data_d3 (delayed 3 ns) outputs of latches 414 and 416 into XOR 424, and between the respective outputs data_d3 and data_d4 (delayed 4 ns) of latches 416 and 418 into XOR 425, and between data_d4 of latch 418 and the original data_in signal into XOR 426. A difference between a data_in signal and any one of the data_dX signals will produce a one at the output of the logic gates 423-426. A one output from any of the logic gates 423-426 will produce a one at the OR gate 440, which is input to the latch 450, detecting a glitch in the data_in signal. Thus FIG. 4 illustrates many discrete time periods at which a glitch may be detected. Each latch 412-418 could represent one nanosecond, or another time period as specified by a circuit designer. Using a configuration such as illustrated in FIG. 4, a glitch or noise may be detected at one of the several time periods before the clock edge that is not detected with a unitary buffer approach, as seen in FIG. 1. The latch delay chain illustrated in FIG. 1 and the latch scheme of FIG. 4 provide various structures and methods for error detection. In some occurrences a capacitance of a line will spread out a transition and delay circuit 100 may be used to detect the glitch.

Figure 5:
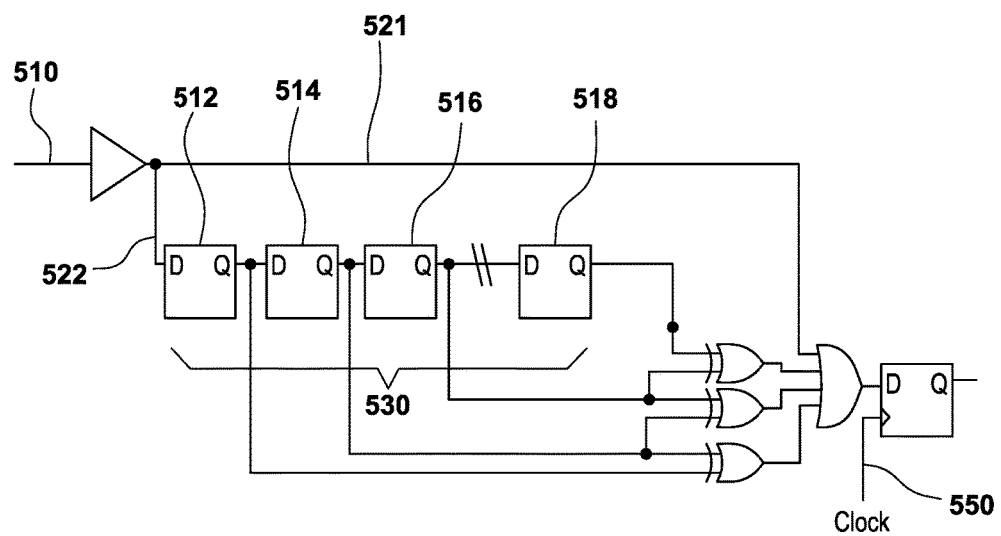
FIG. 5 illustrates a clock delay chain in accordance with embodiments described herein.

FIG. 5 illustrates a clock delay chain 500 in accordance with embodiments described herein. The clock delay chain 500 may be a single delay line similar to the embodiment of FIG. 1, or a sliced delay line of FIG. 5. The clock delay chain 500 is configured to detect a clock glitch or runt pulse in a clock of an input/output bus. Differing from FIGS. 1 and 4, an input to a delay chain of latches 530 is the output of a clock pin 510. The clock line may include a path 521 to be used by the peripheral as a clock, and a delay path 522. Similar to the embodiment of FIG. 4, a plurality of latches 512-518 may stagger a clock signal to determine whether glitches in a clock pulses occur just before a clock edge 550 is triggered. With replication of the flip-flop shown with a falling edge flip-flop, the same circuit may be used not only to detect clock glitches on both clock edges, but also glitches occurring just after the clock. That is, the glitch will appear to be a clock edge of inverted polarity and so it will be detected.

Figure 6A:
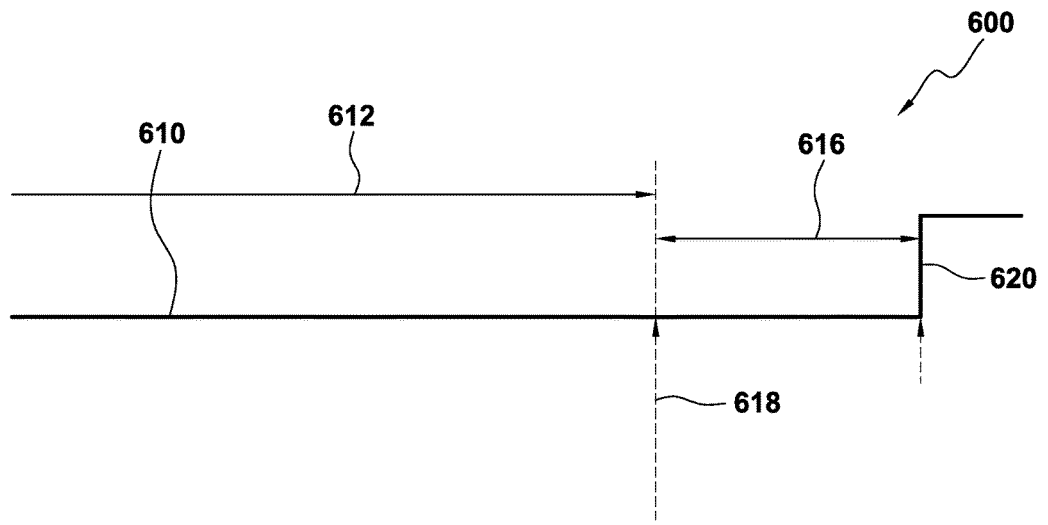
FIGS. 6A and 6B illustrate timing diagrams in accordance with FIG. 5.
Figure 6B:
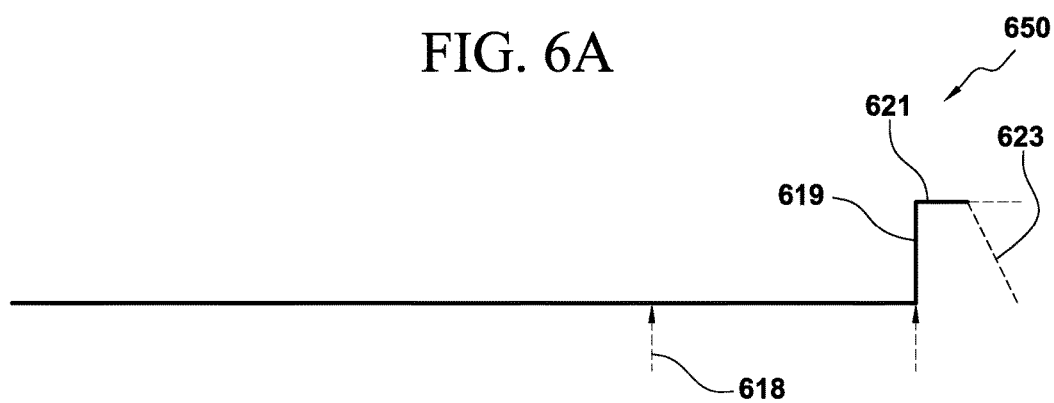

FIGS. 6A and 6B illustrate timing diagrams 600 and 650 in accordance with FIG. 5. FIG. 6A illustrates a clock signal in a normal operative state, with a lead-in clock signal at 610 and a clock edge at 620. After a lead-in time 612, a delay period begins at 618. During a setup time 616, clock stability is desirable before the clock pulse 620. Stability tends to indicate that the clock pulse 620 is a valid clock pulse, there is not a runt pulse or a noise pulse on the clock, and a circuit is functioning normally. The clock edges described herein can be an upward pulse or a downward pulse.

By way of example, a clock having operating at 12.5 MHz may have an eighty nanosecond total period and a 50/50 duty cycle, resulting in an approximately forty nanoseconds high, and approximately forty nanoseconds low period. In a digital domain, the signal is either binary low or high. Low or rising is considered low. High but effectively falling is still considered high. A clock transition is waiting for a definitive switch for it to effectively make the digital transition. In the clock circuit of FIGS. 5 and 6A, the longer a delay buffer of latches 530, shown at latch delay time segment 614 in FIG. 6, the more opportunity exists to detect glitches.

Referring to FIG. 6B, an example clock signal may start out low similar to FIG. 6A. The clock signal may then rise high at positive pulse 619. The pulse remains steady at short pulse 621 then falls off at downward pulse edge 623. The fact that the clock signal loses energy at downward pulse edge 623 indicates that either the leading positive edge or the trailing falling edge represent a glitch, not a true clock pulse, and could be detected with a falling edge flop. When driven back high at short pulse 621 the energy subsides at downward pulse edge 623. The positive pulse at 619 may represent an effect of the glitch on the rising edge, for example a bounce. The glitch drove the clock line high but the energy in the glitch could not sustain it high because the initiator of the clock is holding it low.

The setup time of the latch delay time segment 614 should be sufficient to catch a clock edge that is basically too short, and is therefore a glitch. The circuit may look for the dissipation of a noise spike. Most glitches will be in the one, two, three nanosecond range, to ensure an edge is correctly detected as such. When the edge falls a problem can be detected.

If the transitions occur at 617 and 619 as illustrated in FIG. 6B within this relatively small period of time, then it can be interpreted by the logic as being a very fast clock. If gone undetected, this can interfere with normal operation because the timing of the circuit has not been configured for a very fast clock. If the pulses at 619 or 619 are determined to be clock signals, other circuits that rely on those close signals would be misaligned to this fake clock glitch noise. Thus FIG. 6B illustrates a clock that is not occurring, but rather a glitch that can be misinterpreted as a clock edge, because the logic will not necessarily be able to filter it out.

As described herein, the delay time used for data leading into clock is not related to the delay time used for clock leading into clock. Data is independent of the clock. The clock signals may supposed to pulse at +/− 40 ns. Periods of data switching can be lower.

Figure 7:
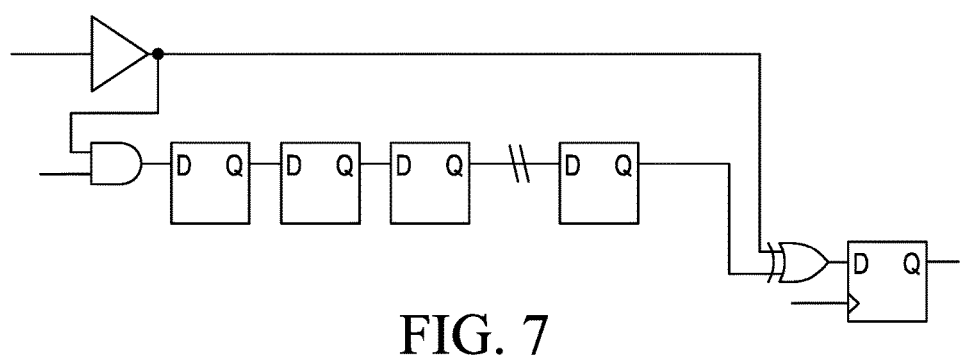
FIG. 7 illustrates another embodiment of a latch delay chain in accordance with embodiments described herein.

FIG. 7 illustrates another embodiment of a delay circuit 700 in accordance with embodiments described herein. In FIG. 7, the latch chain 730 includes an optional AND gate 735 at the data-in side to disable the chain when not in use.

Embodiments described herein may be used in a slave circuit for an input clock if the clock edge is used for data registering. The delay chain (latch or delay buffer) can verify the clock was in the opposite state for a predetermined time period or prior. This will detect clock glitching (false edge and runt pulse). The latches illustrated herein are not limited to any particular type, and can be latches with a natural delay or delay buffers, as determined by a circuit designer in terms of area, power, and accuracy of delay. Different latches may be used with embodiments described herein, such as latches with natural delay, or delay buffers, weighing various factors such as area, power, and accuracy of delay.

Advantages of embodiments described herein include power savings, cost savings, and area savings. Embodiments described herein include a detection mechanism that may be built and performed very inexpensively, that is technology independent, and can be used with varied technologies or process geometry. The circuits will work with standard, normal IO pads. Embodiments described herein use latches, but embodiments are not limited thereto.

Although the various examples of one embodiment have been described in detail with particular reference to certain exemplary aspects thereof, it should be understood that embodiments described herein are capable of other embodiments and its details are capable of modifications in various obvious respects. As is readily apparent to those skilled in the art, variations and modifications can be affected while remaining within the spirit and scope of the embodiments. Accordingly, the foregoing disclosure, description, and figures are for illustrative purposes only and do not in any way limit the embodiments, which is defined only by the claims.

The invention claimed is:

1. A delay circuit, comprising:
a connector pad configured to receive a data input;
a pad pin configured to receive a clock input having a clock edge;
a first data line to receive the data input;
a second data line to receive the data input, the second data line including a delay circuit that outputs a delayed data output; and
a glitch detection circuit including at least one logic gate to accept the data input and delayed data output and output a logic state, wherein the logic state indicates whether there is a glitch in either the data input or the delayed data output;
wherein the delay circuit includes at least one delay element to register the logic state of the at least one logic gate at the clock edge that indicates whether the glitch is detected;
wherein a time difference between the data input and the delayed data output is equal to a circuit setup time period ending at the clock edge; and
wherein the glitch detection circuit is configured to ignore the detected glitch if outside of the circuit setup time period and generate a request to resend the data input if the detected glitch is inside of the circuit setup time period.

2. The delay circuit of claim 1, wherein the delay circuit includes a latch delay chain circuit or a delay buffer.

3. The delay circuit of claim 1, wherein the delay circuit includes a plurality of latches or a plurality of delay buffers.

4. The delay circuit of claim 3,
further comprising a plurality of logic gates,
wherein the data line outputs from the plurality of latches or buffers are used to determine intermittent glitches in the delay circuit.

5. The delay circuit of claim 1,
wherein the at least one logic gate is a single exclusive OR gate.

* * * * *